(12) United States Patent
Jeng et al.

(10) Patent No.: US 11,183,473 B2
(45) Date of Patent: Nov. 23, 2021

(54) INTEGRATED CIRCUIT STRUCTURE HAVING DIES WITH CONNECTORS OF DIFFERENT SIZES

(71) Applicant: Taiwan Semiconductor Manufacturing Company, Ltd., Hsinchu (TW)

(72) Inventors: Shin-Puu Jeng, Hsinchu (TW); Chen-Hua Yu, Hsinchu (TW); Jing-Cheng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 128 days.

(21) Appl. No.: 16/594,677

(22) Filed: Oct. 7, 2019

(65) Prior Publication Data
US 2020/0043879 A1    Feb. 6, 2020

Related U.S. Application Data

(63) Continuation of application No. 13/270,776, filed on Oct. 11, 2011, now Pat. No. 10,475,759.

(51) Int. Cl.
*H01L 25/065* (2006.01)
*H01L 23/31* (2006.01)
(Continued)

(52) U.S. Cl.
CPC .......... *H01L 24/16* (2013.01); *H01L 23/3128* (2013.01); *H01L 23/498* (2013.01); *H01L 23/49827* (2013.01); *H01L 23/49838* (2013.01); *H01L 24/94* (2013.01); *H01L 24/97* (2013.01); *H01L 25/0652* (2013.01); *H01L 25/0655* (2013.01); *H01L 24/05* (2013.01); *H01L 24/13* (2013.01); *H01L 24/81* (2013.01); *H01L 2224/0401* (2013.01);
(Continued)

(58) Field of Classification Search
CPC ......... H01L 24/12–14; H01L 24/15–17; H01L 24/81; H01L 2224/16014; H01L 2224/16057; H01L 2224/16058; H01L 2224/16145; H01L 2224/16148; H01L 2224/16238; H01L 2224/16258; H01L 2224/16221; H01L 25/0652; H01L 25/0655; H01L 2224/1403; H01L 2224/1703
See application file for complete search history.

(56) References Cited

U.S. PATENT DOCUMENTS

| 4,811,082 A | 3/1989 | Jacobs et al. |
| 4,990,462 A | 2/1991 | Sliwa, Jr. |

(Continued)

FOREIGN PATENT DOCUMENTS

| TW | 200409337 A | 6/2004 |
| TW | 201130110 A | 9/2011 |

*Primary Examiner* — Robert G Bachner
*Assistant Examiner* — Molly K Reida
(74) *Attorney, Agent, or Firm* — Slater Matsil, LLP

(57) ABSTRACT

An embodiment is a structure comprising a substrate, a first die, and a second die. The substrate has a first surface. The first die is attached to the first surface of the substrate by first electrical connectors. The second die is attached to the first surface of the substrate by second electrical connectors. A size of one of the second electrical connectors is smaller than a size of one of the first electrical connectors.

20 Claims, 9 Drawing Sheets

(51) Int. Cl.
*H01L 23/498* (2006.01)
*H01L 23/00* (2006.01)

(52) U.S. Cl.
CPC .............. *H01L 2224/05008* (2013.01); *H01L 2224/05022* (2013.01); *H01L 2224/05027* (2013.01); *H01L 2224/05124* (2013.01); *H01L 2224/05144* (2013.01); *H01L 2224/05147* (2013.01); *H01L 2224/05166* (2013.01); *H01L 2224/05572* (2013.01); *H01L 2224/05582* (2013.01); *H01L 2224/05647* (2013.01); *H01L 2224/05655* (2013.01); *H01L 2224/131* (2013.01); *H01L 2224/1308* (2013.01); *H01L 2224/13025* (2013.01); *H01L 2224/13083* (2013.01); *H01L 2224/13111* (2013.01); *H01L 2224/13139* (2013.01); *H01L 2224/13147* (2013.01); *H01L 2224/14181* (2013.01); *H01L 2224/16145* (2013.01); *H01L 2224/16148* (2013.01); *H01L 2224/16225* (2013.01); *H01L 2224/16238* (2013.01); *H01L 2224/16258* (2013.01); *H01L 2224/32145* (2013.01); *H01L 2224/32225* (2013.01); *H01L 2224/73204* (2013.01); *H01L 2224/81191* (2013.01); *H01L 2224/81193* (2013.01); *H01L 2224/81455* (2013.01); *H01L 2224/81815* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2924/00014* (2013.01); *H01L 2924/157* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 5,075,253 | A | 12/1991 | Sliwa, Jr. |
| 5,380,681 | A | 1/1995 | Hsu |
| 5,481,133 | A | 1/1996 | Hsu |
| 6,002,177 | A | 12/1999 | Gaynes et al. |
| 6,187,678 | B1 | 2/2001 | Gaynes et al. |
| 6,229,216 | B1 | 5/2001 | Ma et al. |
| 6,236,115 | B1 | 5/2001 | Gaynes et al. |
| 6,271,059 | B1 | 8/2001 | Bertin et al. |
| 6,279,815 | B1 | 8/2001 | Correia et al. |
| 6,355,501 | B1 | 3/2002 | Fung et al. |
| 6,434,016 | B2 | 8/2002 | Zeng et al. |
| 6,448,661 | B1 | 9/2002 | Kim et al. |
| 6,461,895 | B1 | 10/2002 | Liang et al. |
| 6,562,653 | B1 | 5/2003 | Ma et al. |
| 6,570,248 | B1 | 5/2003 | Ahn et al. |
| 6,600,222 | B1 | 7/2003 | Levardo |
| 6,607,938 | B2 | 8/2003 | Kwon et al. |
| 6,661,085 | B2 | 12/2003 | Kellar et al. |
| 6,762,076 | B2 | 7/2004 | Kim et al. |
| 6,777,816 | B2 | 8/2004 | Kazama et al. |
| 6,790,748 | B2 | 9/2004 | Kim et al. |
| 6,887,769 | B2 | 5/2005 | Kellar et al. |
| 6,908,565 | B2 | 6/2005 | Kim et al. |
| 6,908,785 | B2 | 6/2005 | Kim |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,975,016 | B2 | 12/2005 | Kellar et al. |
| 7,037,804 | B2 | 5/2006 | Kellar et al. |
| 7,056,807 | B2 | 6/2006 | Kellar et al. |
| 7,087,538 | B2 | 8/2006 | Staines et al. |
| 7,151,009 | B2 | 12/2006 | Kim et al. |
| 7,157,787 | B2 | 1/2007 | Kim et al. |
| 7,215,033 | B2 | 5/2007 | Lee et al. |
| 7,276,799 | B2 | 10/2007 | Lee et al. |
| 7,279,795 | B2 | 10/2007 | Periaman et al. |
| 7,307,005 | B2 | 12/2007 | Kobrinsky et al. |
| 7,317,256 | B2 | 1/2008 | William et al. |
| 7,320,928 | B2 | 1/2008 | Kloster et al. |
| 7,345,350 | B2 | 3/2008 | Sinha |
| 7,402,442 | B2 | 7/2008 | Condorelli et al. |
| 7,402,515 | B2 | 7/2008 | Arana et al. |
| 7,410,884 | B2 | 8/2008 | Ramanathan et al. |
| 7,432,592 | B2 | 10/2008 | Shi et al. |
| 7,494,845 | B2 | 2/2009 | Hwang et al. |
| 7,528,494 | B2 | 5/2009 | Furukawa et al. |
| 7,531,890 | B2 | 5/2009 | Kim |
| 7,557,597 | B2 | 7/2009 | Anderson et al. |
| 7,569,935 | B1 | 8/2009 | Fan |
| 7,576,435 | B2 | 8/2009 | Chao |
| 7,834,450 | B2 | 11/2010 | Kang |
| 8,535,961 | B1* | 9/2013 | Kuo .................. H01L 24/24 438/28 |
| 2003/0062620 | A1* | 4/2003 | Shibata ............. H01L 25/0652 257/723 |
| 2004/0106230 | A1 | 6/2004 | Chan et al. |
| 2004/0108579 | A1 | 6/2004 | Kazama et al. |
| 2005/0006752 | A1 | 1/2005 | Ogawa |
| 2006/0094224 | A1* | 5/2006 | Huang .................. H01L 24/11 438/612 |
| 2006/0264022 | A1 | 11/2006 | Sugimura et al. |
| 2007/0141750 | A1* | 6/2007 | Iwasaki .............. H01L 24/13 438/108 |
| 2008/0136003 | A1 | 6/2008 | Pendse |
| 2009/0209062 | A1 | 8/2009 | Egawa |
| 2009/0230567 | A1 | 9/2009 | Kiong et al. |
| 2009/0289350 | A1 | 11/2009 | Watanabe |
| 2010/0246152 | A1 | 9/2010 | Lin et al. |
| 2011/0140283 | A1* | 6/2011 | Chandra ............. H01L 25/0652 257/777 |

* cited by examiner

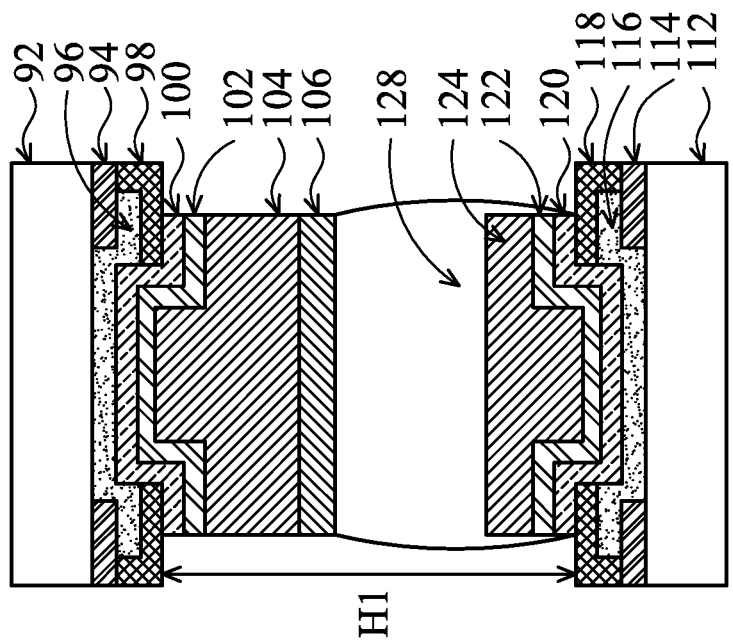
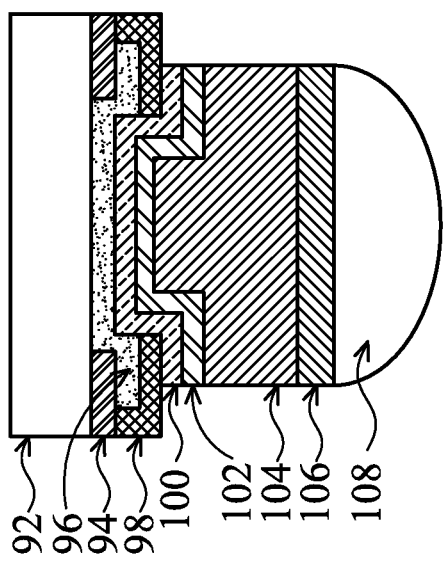 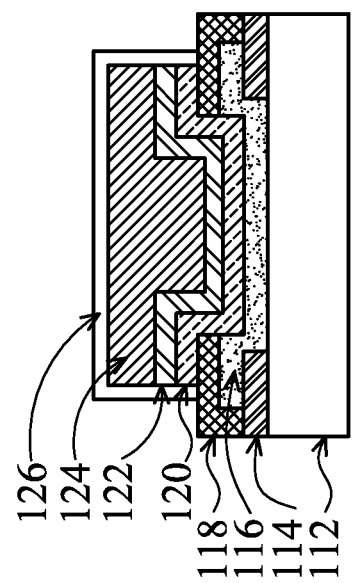
Figure 7A
Figure 7B

INTEGRATED CIRCUIT STRUCTURE HAVING DIES WITH CONNECTORS OF DIFFERENT SIZES

PRIORITY CLAIM AND CROSS-REFERENCE

This application is a continuation of U.S. patent application Ser. No. 13/270,776, filed Oct. 11, 2011 and entitled "Integrated Circuit Structure Having Dies with Connectors of Different Sizes," which application is incorporated herein by reference it its entirety.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. Various techniques have been developed to attempt to incorporate extra dimensionality into IC structures.

One technique is referred to as a two and a half dimensional (2.5D) structure. These structures typically have interposers having a die stacked on the interposer. Interposers have been used to redistribute ball contact areas from that of the chip to a larger area of the interposer. Further, interposers have allowed for a package that includes multiple chips.

Other techniques stack chips in a three dimensional (3D) structure. This allows for greater functionality with a reduced footprint of the structure.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 7A and 7B are a second connector for a 2.5DIC structure according to an embodiment;

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely two and a half dimensional integrated circuit (2.5DIC) structures. Other embodiments may also be applied, however, to three dimensional integrated circuit (3DIC) structures or other structures where different bonding precisions for bumps on dies can be used.

Figure 1:
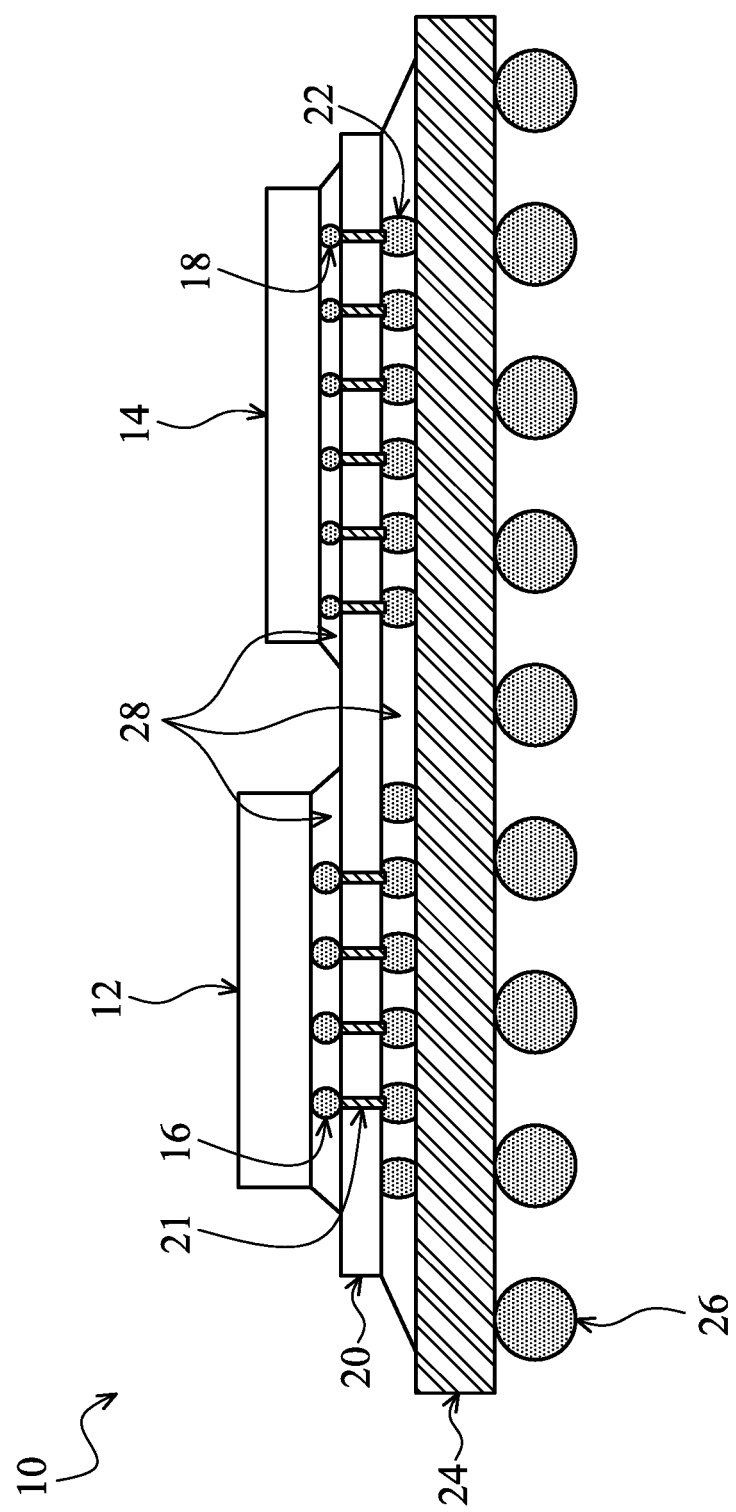
FIG. 1 is a two and a half dimensional integrated circuit (2.5DIC) structure according to an embodiment.

FIG. 1 illustrates a 2.5DIC structure 10 according to an embodiment. The structure 10 comprises a first die 12 and a second die 14 each attached to an interposer 20 having through substrate vias (TSVs) 21. The interposer 20 is attached to a substrate 24. The first die 12 is attached to a top surface of the interposer 20 by first connectors 16, such as minibumps or controlled collapse chip connection (C4) bumps, and the second die 14 is attached to the top surface of the interposer 20 by second connectors 18, such as microbumps. A bottom surface of the interposer 20 is attached to a top surface of the substrate 24 by third connectors 22, such as C4 bumps. A bottom surface of the substrate 24 has fourth connectors 26, such as ball grid array (BGA) balls, attached. An underfill material 28 is between the first die 12 and the interposer 20, between the second die 14 and the interposer 20, and between the interposer 20 and the substrate 24. It should be noted that the interposer 20 may instead be an active die for a 3DIC structure.

In embodiments, the first die 12 may be a die having a low density of inputs and outputs, such as a dynamic random access memory (DRAM) die, a memory stack of dies, a radio frequency signal processing die, or the like. In embodiments, the second die 14 can have a high density of inputs or outputs, such as a graphics processing unit (GPU) die, a logic device die, or the like.

Figure 2:
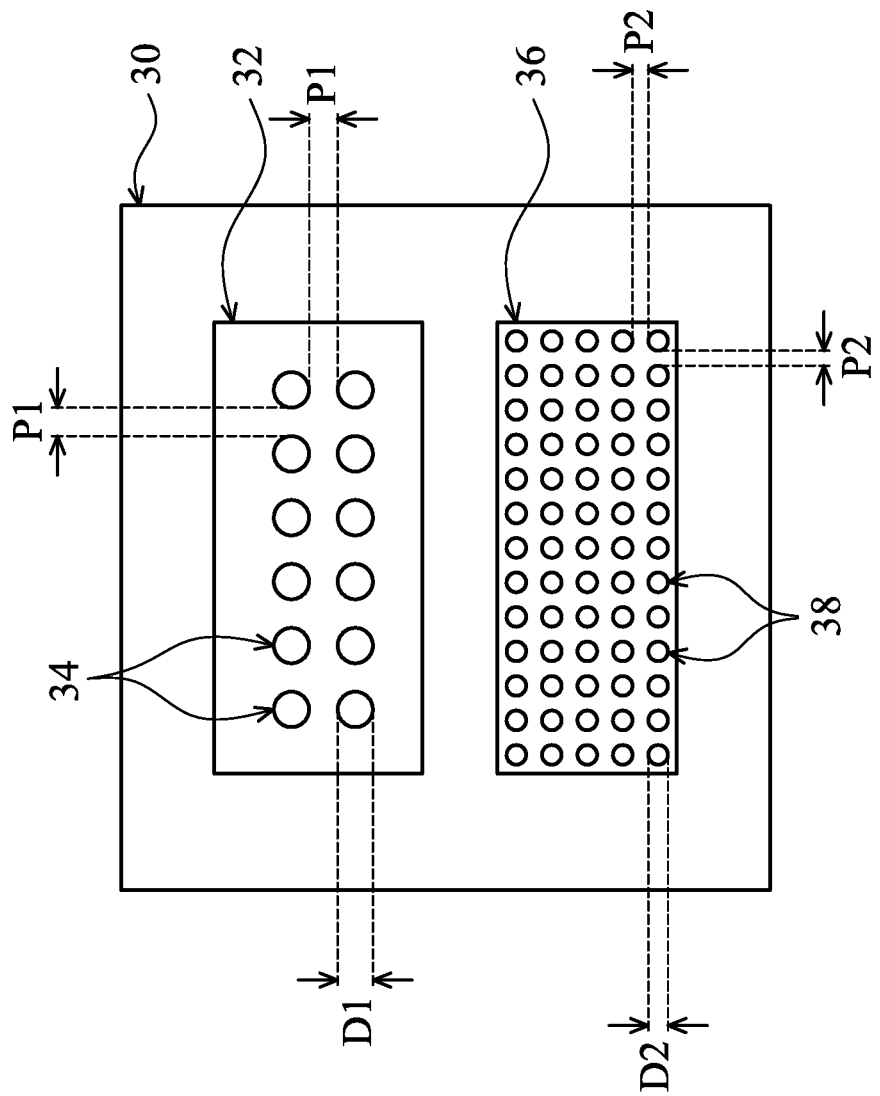
FIG. 2 is a layout view of an interposer of the 2.5DIC structure of FIG. 1 according to an embodiment.

In this embodiment, a size and pitch of the first connectors 16 is larger than a size and a pitch of the second connectors 18, respectively. FIG. 2 illustrates a layout 30 of the interposer 20 as an example of the size and pitch of the first connectors 16 and the second connectors 18. The layout 30 comprises a first die area 32 of the first die 12 and a second die area 36 of the second die 14. The first die area 32 has first connector areas 34 each having a diameter D1 and has pitches P1 between the first connector areas 34. Similarly, the second die area 36 has second connector areas 38 each having a diameter D2 and has pitches P2 between the second connector areas 38. As shown, the diameter D1 and the pitch P1 is larger than the diameter D2 and the pitch P2, respectively.

The following tables provide example approximate dimensions for the diameters and pitches illustrated in FIG. 2 for some embodiments. A person having ordinary skill in the art will readily realize that these dimensions may be modified for different technologies.

TABLE 1

| Diameter D1 | Diameter D2 |
|---|---|
| 35 μm-50 μm | 10 μm-20 μm |
| 35 μm-90 μm | 20 μm-30 μm |

TABLE 2

| Diameter D1 | Pitch P1 |
|---|---|
| 30 µm-45 µm | 60 µm |
| 50 µm-75 µm | 120 µm |
| 80 µm-110 µm | 160 µm |

TABLE 3

| Diameter D2 | Pitch P2 |
|---|---|
| 10 µm-13 µm | 20 µm |
| 15 µm-18 µm | 30 µm |
| 20 µm-26 µm | 40 µm |

Generally, the first connectors 16 can have a diameter D1 between 30 µm and 150 µm, and the second connectors 18 can have a diameter D2 between 10 µm and 30 µm. Further, the first connectors 16 can have a pitch P1 of greater than 50 µm, such as equal to or greater than 60 µm, and the second connectors 18 can have a pitch P2 of equal to or less than 50 µm.

Bonding of the first connectors 16 can have a larger accuracy window than the bonding of the second connectors 18. For example, the bonding tool that bonds the first connectors 16 can have an accuracy between approximately 7 µm and approximately 10 µm, and the bonding tool that bonds the second connectors 18 can have an accuracy of equal to or less than approximately 3 µm. By having a larger bonding accuracy, the cost of bonding the first connectors 16 may be between approximately 20 percent and approximately 30 percent of the cost of bonding the second connectors 18. Further, the throughput of bonders with these accuracies can be much greater for the first connectors 16 than for the second connectors 18, such as between 2,000 and 4,000 units per hour compared to between 500 and 700 units per hour.

Figure 3:
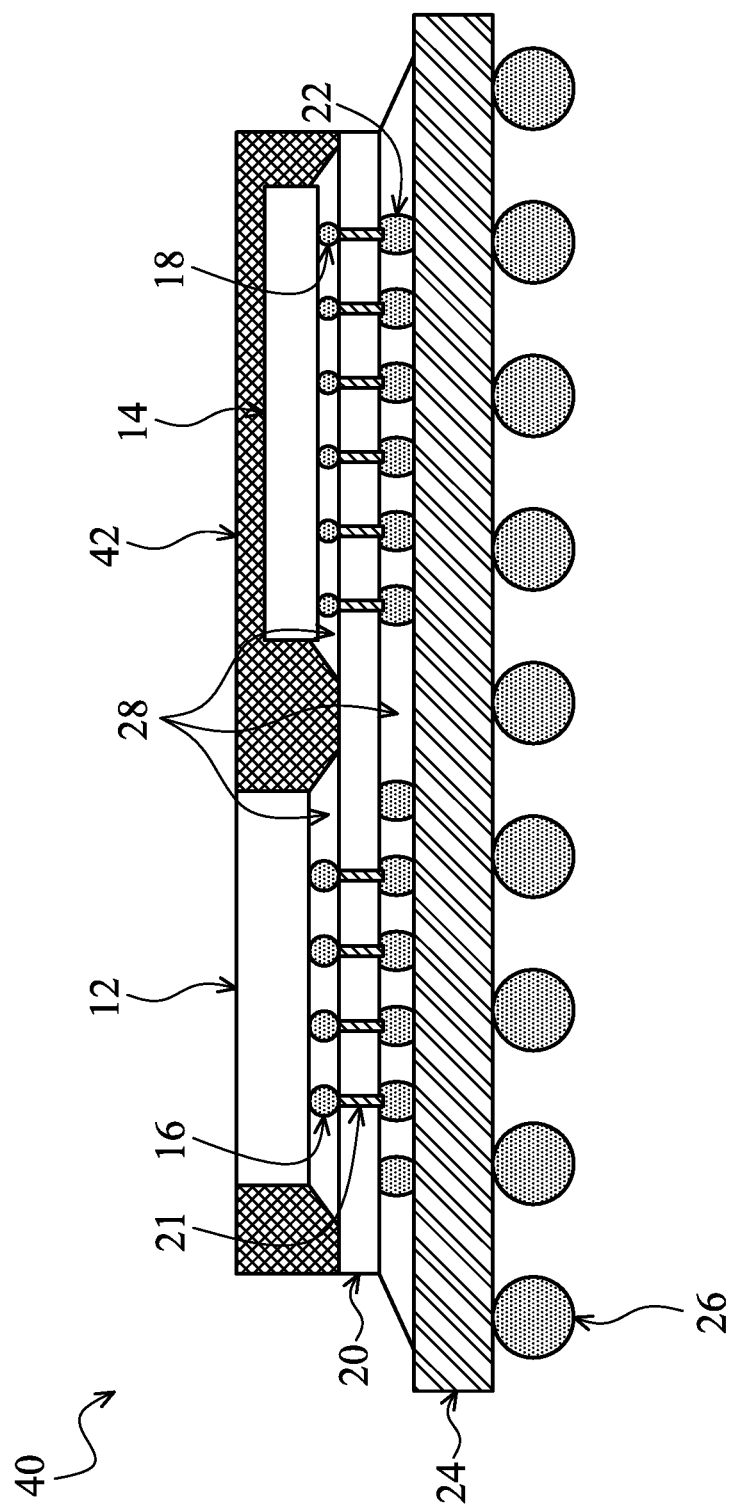
FIG. 3 is another 2.5DIC structure according to an embodiment.

FIG. 3 illustrates another 2.5DIC structure 40 according to an embodiment. The structure 40 comprises the components of the structure 10 in FIG. 1. Additionally, the structure 40 comprises a molding compound 42 encapsulating the first die 12 and the second die 14. In this embodiment, the height of the first die 12 from the interposer 20 is greater than the height of the second die 14. The molding compound 42, after being applied, such as by compression molding, and after being cured, is ground and/or polished, such as by a chemical mechanical polishing (CMP) process, to expose a surface of the first die 12. A surface of the second die 14 is not exposed because the height of the second die 14 is less than the first die 12. In other embodiments, a heat-dissipating material may be on a top surface of the second die 14, and the heat dissipating material may be exposed through the molding compound 42 along with the top surface of the first die 12.

Figure 4:
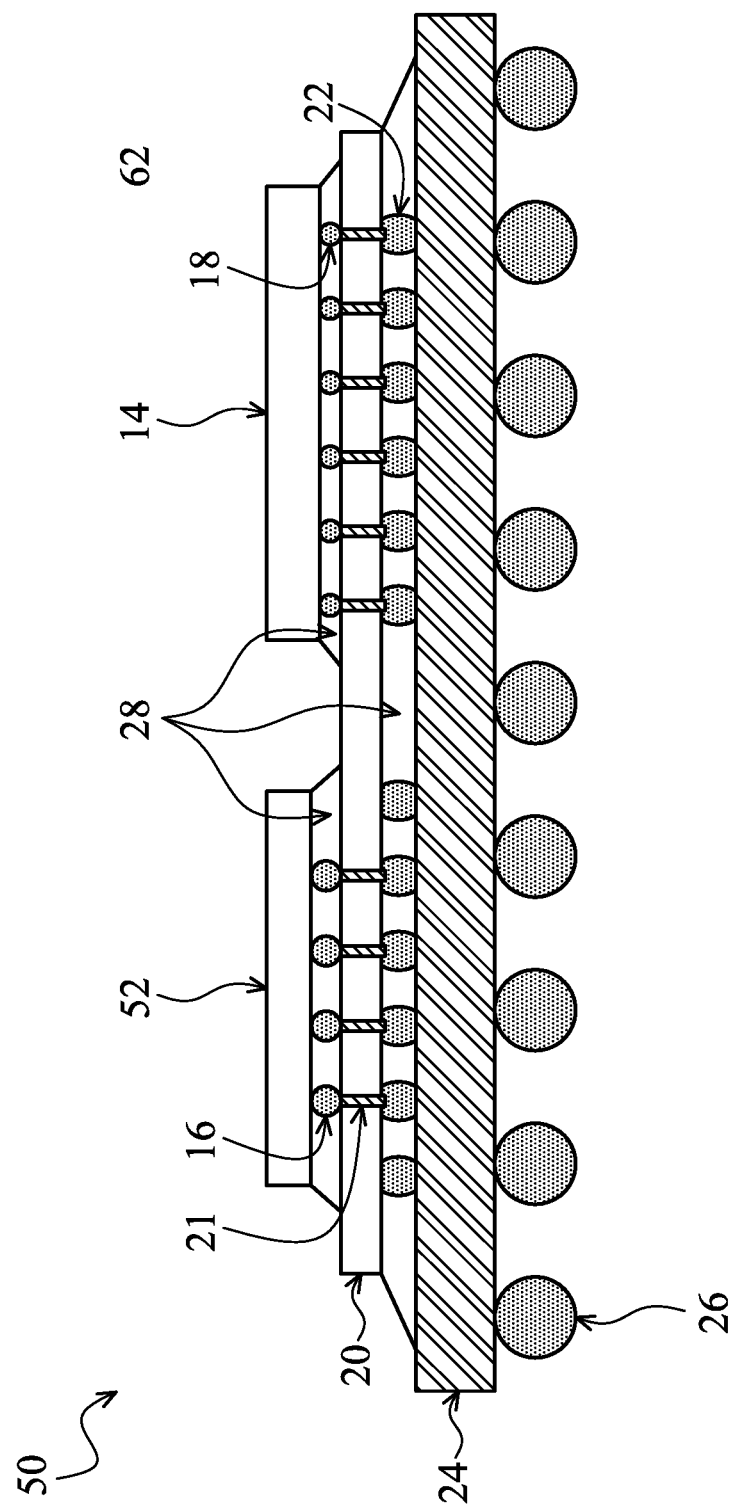
FIG. 4 is a further 2.5DIC structure according to an embodiment.
Figure 5:
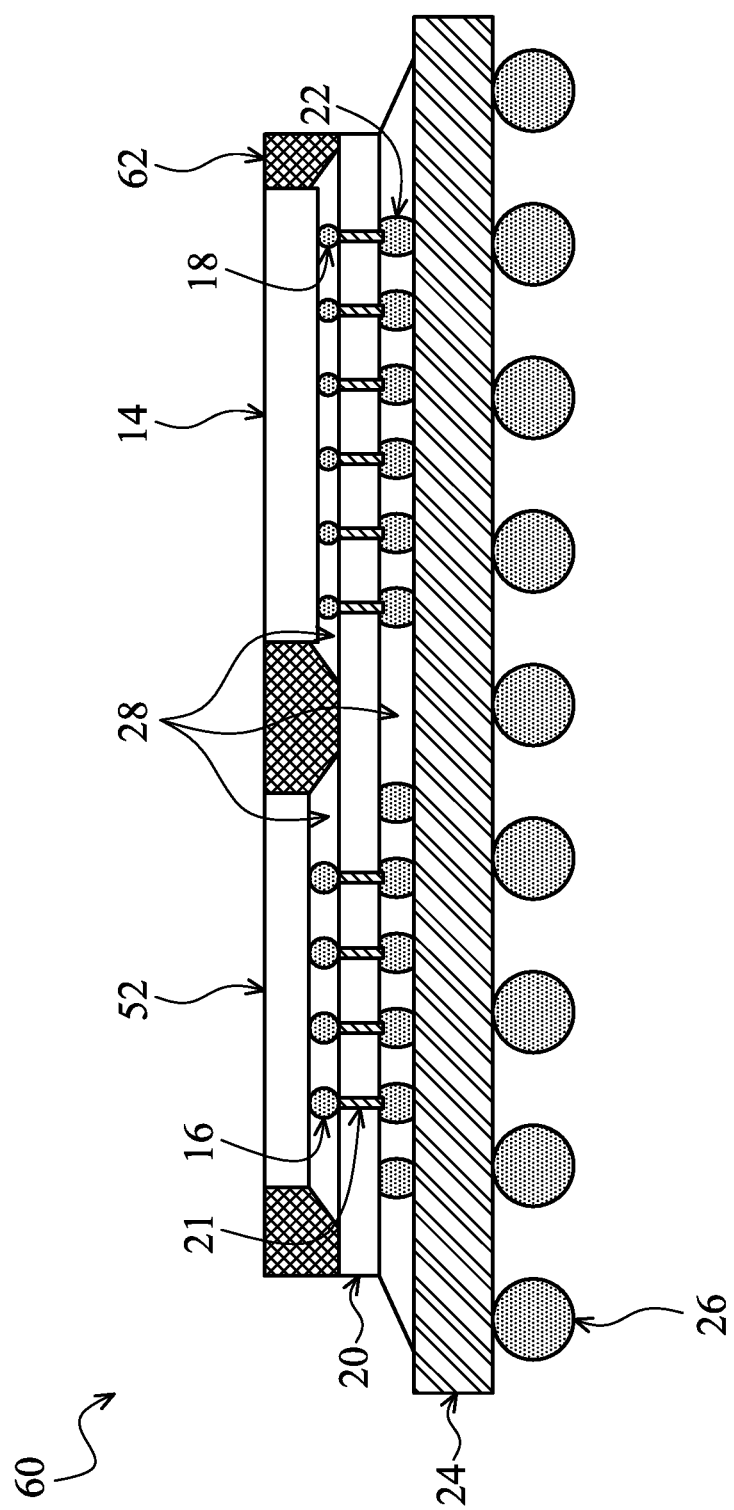
FIG. 5 is another 2.5DIC structure according to an embodiment.

FIG. 4 illustrates another 2.5DIC structure 50 according to an embodiment. The structure 50 is similar to the structure 10 in FIG. 1. The first die 12 in FIG. 1 is replaced with a thinner first die 52. The height of the thinner first die 52 with the first connections 16 measured from the interposer 20 is equal to the height of the second die 14 with the second connections 18 measured from the interposer 20. Thus, as shown in the embodiment of FIG. 5, when a molding compound 62 is applied to the structure 60, respective top surfaces of the thinner first die 52 and the second die 14 are exposed through the molding compound 62.

Figure 6:
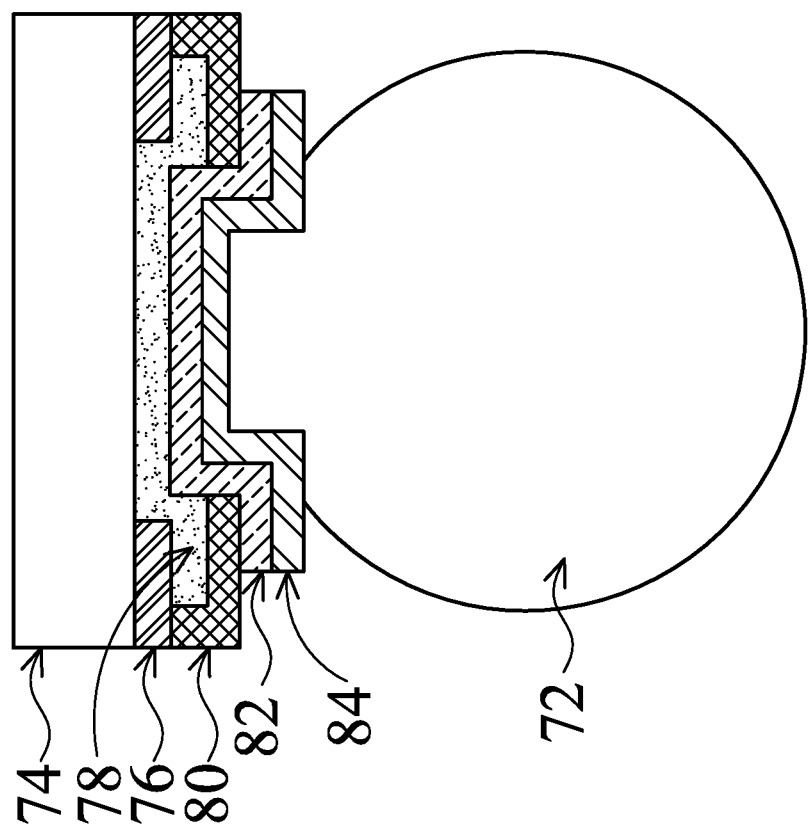
FIG. 6 is a first connector for a 2.5DIC structure according to an embodiment.

FIG. 6 illustrates the formation of one first connector 72 of the first connectors 16 on the first die 12 before bonding to the interposer 20. A substrate portion 74 of the first die 12 may be any combination of semiconductor substrate, dielectric layers, and/or metallization layers. A first passivation layer 76 covers the substrate portion 74. A post-passivation interconnect (PPI) 78 is formed through an opening in the first passivation layer 76. The PPI 78 may electrically couple a metallization component within the substrate portion 74. A second passivation layer 80 covers the first passivation layer 76 and a portion of the PPI 78. A first underbump metal (UBM) layer 82 is in an opening through the second passivation layer 80 to electrically couple the PPI 78. A second UBM layer 84 covers the first UBM layer 82. The first connector 72 is on the second UBM layer 84.

The first passivation layer 76 is formed over the substrate portion 74. The first passivation layer 76 may be a polymer such as polyimide, silicon oxide, silicon nitride, low-k dielectric, extremely low-k dielectric, the like, or a combination thereof. The first passivation layer 76 is formed using, for example, chemical vapor deposition (CVD), spin-on coating, or any suitable deposition technique. The opening through the first passivation layer 76 can be formed by using, for example, a suitable photolithographic mask and etching process.

The PPI 78 is formed to extend through the opening in the first passivation layer 76. The PPI 78 is formed by initially forming a seed layer (not shown), such as a titanium copper alloy, through a suitable formation process such as CVD or sputtering. A photoresist (not shown) may then be formed to cover the seed layer, and the photoresist may then be patterned to expose those portions of the seed layer that are located where the PPI 78 is desired to be located. Once the photoresist has been formed and patterned, a conductive material, such as copper, may be formed on the seed layer through a deposition process such as plating. Other suitable materials, such as AlCu or Au, and other suitable processes of formation, such as CVD or PVD, may be used to form the PPI 78.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the PPI 78 has been formed, the second passivation layer 80 is formed. The second passivation layer 80 may be formed from a polymer such as polyimide, or may be formed of silicon oxide, silicon nitride, low-k dielectric, extremely low-k dielectric, the like, or a combination thereof. An opening is made through the second passivation layer 80 by removing portions of the second passivation layer 80 to expose at least a portion of the underlying PPI 78. The opening is formed using, for example, a suitable photolithographic mask and etching process.

The first UBM layer 82 is formed in electrical contact with the PPI 78 and the second UBM layer 84 is formed over the first UBM layer 82. In this embodiment, the first UBM layer 82 is titanium, and the second UBM layer 84 is copper. Although shown with two layers, the UBM may comprise different numbers of layers, such as three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM. Any suitable materials or layers of material that may be used for the UBM are fully intended to be included within the scope of the current application.

The UBM may be created by forming each of the first UBM layer 82 and the second UBM layer 84 over the second passivation layer 80 and in the opening in the second passivation layer 80. Each layer may be formed using, for example, a plating process, such as electrochemical plating, although other processes of formation, such as sputtering, evaporation, or PECVD process, may be used. Once the layers have been formed, portions of the layers may then be removed through a suitable photolithographic masking and etching process to remove the undesired material and to leave the UBM in a desired shape, such as a circular, octagonal, square, or rectangular shape, although any desired shape may alternatively be formed.

The first connector 72 may be a contact bump and may comprise a material such as lead free solder, or other suitable materials, such as silver, tin, or copper. In an embodiment, the first connector 72 may be formed by forming a layer of tin through methods such as evaporation, electroplating, printing, solder transfer, ball placement, etc. Once a layer of tin has been formed on the structure, a reflow may be performed in order to shape the material into the desired shape.

Once the first connectors 16 are formed on the first die 12, such as discussed with respect to FIG. 6, the first die 12 is attached to the interposer 20, such as by attaching the first connectors 16 to pads on the interposer 20. The first connectors 16 are reflowed to form a permanent connection between the first die 12 and the interposer 20.

FIGS. 7A and 7B illustrate an example of the formation of a second connector 18. FIG. 7A shows a substrate portion 92 of the second die 14, a first passivation layer 94, a PPI 96, a second passivation layer 98, a first UBM layer 100, and a second UBM layer 102. FIG. 7A further shows a substrate portion 112 of the interposer 20, a first passivation layer 114, a PPI 116, a second passivation layer 118, a first UBM layer 120, and a second UBM layer 122. These components in FIG. 7A can be formed the same or similarly as discussed with regard to corresponding components in FIG. 6 with appropriate modifications for sizes and pitches.

After the formation of the conductive materials for the UBM and before the removal of undesired UBM materials, a seed layer is deposited on the second UBM layer 102, such as a copper or copper alloy formed by physical vapor deposition (PVD) or other deposition methods. A mask is formed over the seed layer and has an opening over the desired UBM pattern. The mask may be formed of a photo resist, for example, patterned using photolithography. Accordingly, a portion of the seed layer is exposed through an opening in the mask.

Next, a plating is performed to form metal pillar 104 on the second UBM layer 102 and in the opening of the mask. The plating may be an electro-plating, an electroless-plating, an immersion plating, or the like. In an embodiment, metal pillar 104 is a copper or copper alloy, and in other embodiments, the metal pillar 104 may be Sn—Ag, Sn—Ag—Cu, or the like, and may be lead-free or lead-containing.

In this embodiment, the metal pillar 104 is copper, and a top layer 106, such as a nickel, a tin layer, a palladium, a gold layer, alloys thereof, and multi-layers thereof, are formed on the surface of metal pillar 104. The mask is then removed, such as by an ash and/or flush process when the mask is a photoresist. The portion of the UBM, such as the first UBM layer 100 and the second UBM layer 102, previously covered by mask is also removed, for example, by an etch.

The solder material 108 can comprise a material such as lead free solder, or other suitable materials, such as silver, tin, or copper. In an embodiment, the solder material 108 may be formed by forming a layer of tin through methods such as evaporation, electroplating, printing, solder transfer, ball placement, etc. Once a layer of tin has been formed on the structure, a reflow may be performed in order to shape the material into the desired shape.

The metal pillar 124, the second UBM layer 122, and the first UBM layer 120 on the interposer is similarly formed as the corresponding components on the substrate portion 92 of the second die 14. The metal pillar 124 is formed to a lesser thickness than the metal pillar 104. After the metal pillar 124 is formed, the mask is then removed, such as by an ash and/or flush process when the mask is a photoresist. The portion of the UBM, such as the first UBM layer 120 and the second UBM layer 122, previously covered by mask is also removed, for example, by an etch.

Exposed portions of the first UBM layer 120, the second UBM layer 122, and the metal pillar 124 are covered by a cover layer 126. The cover layer 126 in this embodiment is electroless nickel, electroless palladium, immersion gold (ENEPIG). In other embodiments, the cover layer 126 is electroless nickel, electroless nickel and immersion gold (ENIG).

In FIG. 7B, the structures of FIG. 7A are brought together and the solder material 108 and the cover layer 126 are reflowed to form a reflowed portion 128. The metal pillar 104, top layer 106, reflowed portion 128, and metal pillar 124 form one of the second connectors 18. A height H1 between a surface of the interposer 20 and a surface of the second die 14 can be between approximately 20 μm and approximately 30 micrometers.

Figure 8B:
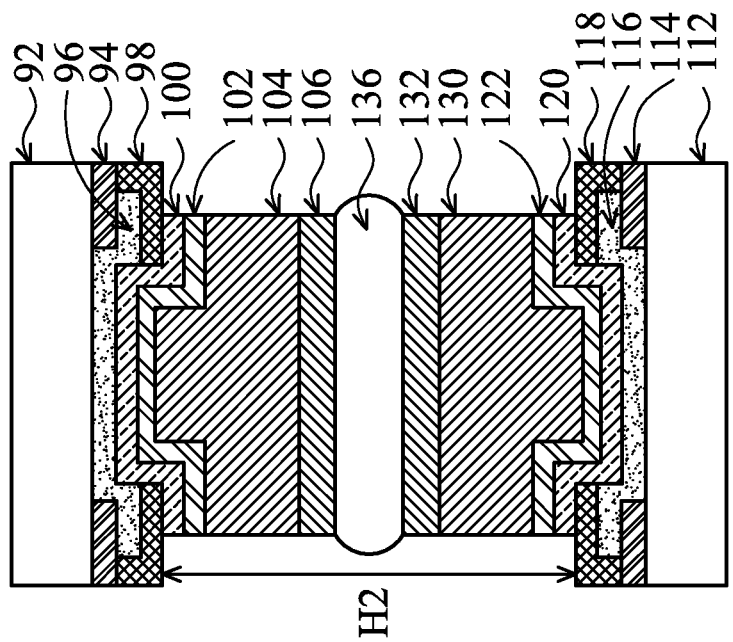
FIGS. 8A and 8B are another second connector for a 2.5DIC structure according to an embodiment.
Figure 8A:
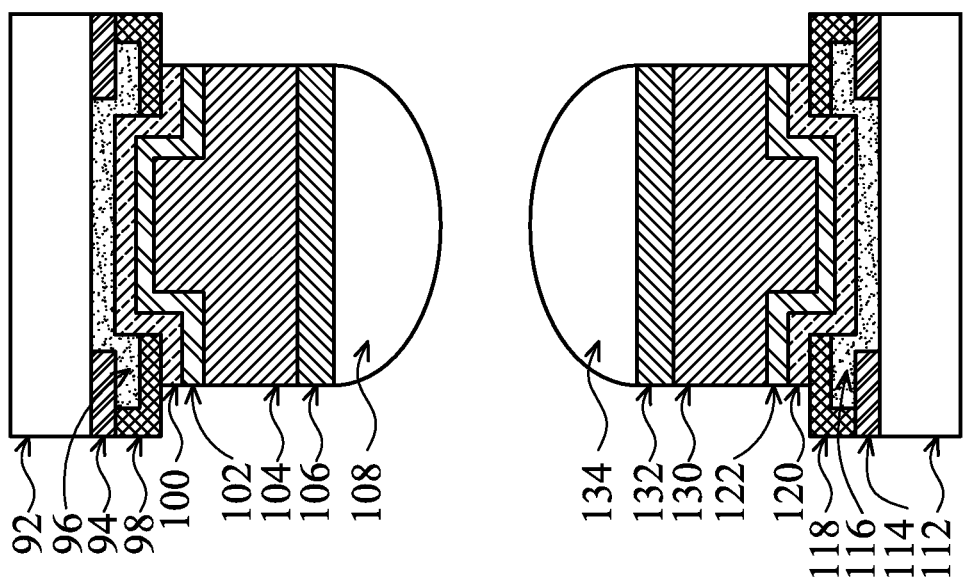

FIGS. 8A and 8B illustrate another example of the formation of a second connector 18. FIG. 8A shows a substrate portion 92 of the second die 14, a first passivation layer 94, a PPI 96, a second passivation layer 98, a first UBM layer 100, a second UBM layer 102, a metal pillar 104, a top layer 106, and a solder material 108. FIG. 8A further shows a substrate portion 112 of the interposer 20, a first passivation layer 114, a PPI 116, a second passivation layer 118, a first UBM layer 120, a second UBM layer 122, a metal pillar 130, a top layer 132, and a solder material 134. Corresponding components are formed in a same or similar manner as discussed with respect to FIG. 7A for components on the substrate portion 92 of the second die 14.

In FIG. 8B, the structures of FIG. 8A are brought together and the solder materials 108 and 134 are reflowed to form a reflowed portion 136. The metal pillar 104, top layer 106, reflowed portion 136, top layer 132, and metal pillar 130 form one of the second connectors 18. A height H2 between a surface of the interposer 20 and a surface of the second die 14 can be between approximately 30 μm and approximately 55 micrometers.

An embodiment is a structure comprising a substrate, a first die, and a second die. The substrate has a first surface. The first die is attached to the first surface of the substrate by first electrical connectors. The second die is attached to the first surface of the substrate by second electrical connectors. A size of one of the second electrical connectors is smaller than a size of one of the first electrical connectors.

Another embodiment is a structure comprising a substrate, a first die, and a second die. The substrate has a surface, and the surface comprises a first die-attach area and a second die-attach area. The first die is on the substrate in the first die-attach area, and the first die is electrically and mechanically coupled by first connectors to the substrate. The first connectors each have a first diameter along the first die-attach area and have a first pitch between respective adjacent ones of the first connectors along the first die-attach area. The second die is on the substrate in the second die-attach area, and the second die is electrically and mechanically coupled by second connectors to the substrate. The second connectors each have a second diameter along the second die-attach area and have a second pitch between respective adjacent ones of the second connectors along the second die-attach area. The first diameter is greater than the second diameter, and the first pitch is greater than the second pitch.

A further embodiment is a method for forming a structure. The method comprises attaching a first die to a surface of a substrate, the first die being attached by first electrical connectors, the first electrical connectors having a first size; and attaching a second die to the surface of the substrate, the second die being attached by second electrical connectors, the second electrical connectors having a second size, the first size being greater than the second size.

Figure 9:
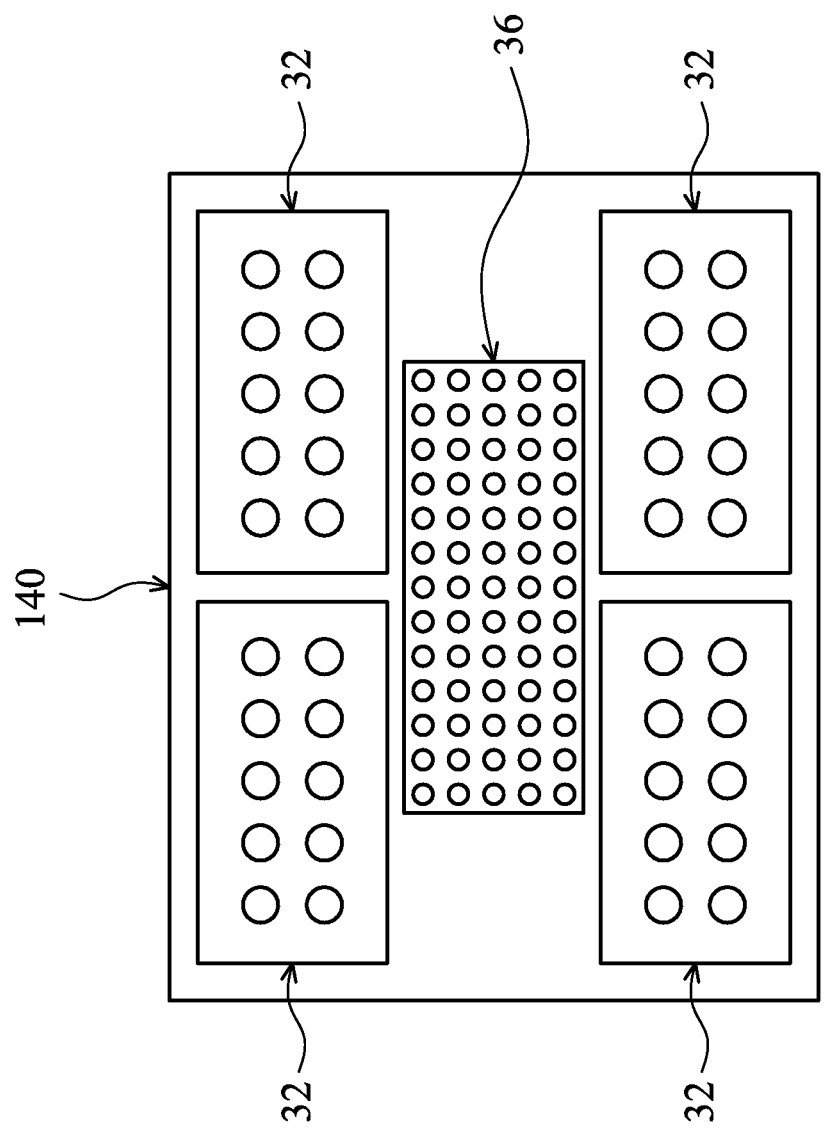
FIG. 9 is another layout view of an interposer of a 2.5DIC structure according to an embodiment.

Although the present embodiments and their advantages have been described in detail, it should be understood that various changes, substitutions and alterations can be made herein without departing from the spirit and scope of the disclosure as defined by the appended claims. For example, although the foregoing embodiments were discussed with respect to structures comprising two dies, embodiments can have any number of dies with any combination of connectors attaching those dies. FIG. 9 is an example to illustrate this. FIG. 9 shows an interposer layout 140 comprising four first die areas 32 and one second die area 36.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
  an interposer;
  a first die on a first surface of the interposer, the first die being electrically and mechanically coupled to the interposer by first connectors, the first connectors having a first diameter and having a first pitch between adjacent ones of the first connectors; and
  a second die on the first surface of the interposer, the second die being electrically and mechanically coupled to the interposer by second connectors, the second connectors having a second diameter and having a second pitch between adjacent ones of the second connectors, the first diameter being greater than the second diameter, and the first pitch being greater than the second pitch, wherein each of the second connectors comprises:
    a first under bump metal (UBM) structure on a lower side of the second die facing the interposer;
    a first metal pillar electrically and mechanically coupled to the first UBM structure;
    a first conductive layer on a lower surface of the first metal pillar facing the interposer;
    a second UBM structure on the first surface of the interposer;
    a second metal pillar electrically and mechanically coupled to the second UBM structure; and
    a solder material between and electrically coupling the first metal pillar and the second metal pillar, wherein sidewalls of the first metal pillar and sidewalls of the first conductive layer are free of the solder material, wherein the solder material contacts and extends along sidewalls of the second metal pillar and sidewalls of the second UBM structure.

2. The structure of claim 1, wherein the solder material contacts the first surface of the interposer.

3. The structure of claim 1, wherein the solder material extends beyond sidewalls of the first metal pillar and beyond sidewalls of the second metal pillar.

4. The structure of claim 1, further comprising a substrate electrically and mechanically coupled by third connectors to the interposer, wherein the interposer is between the substrate and the first die.

5. The structure of claim 4, further comprising:
  a first underfill between the first die and the interposer;
  a second underfill between the second die and the interposer; and
  a third underfill between the substrate and the interposer, wherein the first underfill, the second underfill, and the third underfill have a same composition.

6. The structure of claim 4, further comprising a molding material on the interposer around the first die and the second die.

7. The structure of claim 6, wherein a first upper surface of the first die distal from the interposer is exposed by the molding material, and a second upper surface of the second die distal from the interposer is covered by the molding material.

8. The structure of claim 1, wherein the solder material contacts the first conductive layer and an upper surface of the second metal pillar facing the second die.

9. The structure of claim 8, wherein the solder material extends continuously from the first conductive layer to the upper surface of the second metal pillar.

10. The structure of claim 1, wherein sidewalls of the second metal pillar are aligned with the sidewalls of the second UBM structure along respective vertical lines.

11. A structure comprising:
  a first die attached to a first side of an interposer by first connectors; and
  a second die attached to the first side of the interposer by second connectors, the second die being laterally adjacent to the first die, wherein each of the second connectors comprises:
    a first metal pillar protruding from a lower surface the second die facing the interposer;
    a first conductive layer on a surface of the first metal pillar facing the interposer, wherein sidewalls of the first conductive layer are aligned vertically with respective sidewalls of the first metal pillar;
    a second metal pillar protruding from an upper surface of the interposer facing the second die; and
    a solder region between and electrically coupling the first metal pillar and the second metal pillar, wherein the solder region contacts the first conductive layer and an upper surface of the second metal pillar facing the second die, wherein sidewalls of the first metal pillar and sidewalls of the first conductive layer are free of the solder region, wherein the solder region contacts and extends along sidewalls of the second metal pillar.

12. The structure of claim 11, wherein the first connectors have a first diameter and have a first pitch in between, wherein the second connectors have a second diameter and have a second pitch in between, wherein the first diameter is larger than the second diameter, and the first pitch is larger than the second pitch.

13. The structure of claim 11, wherein the upper surface of the second metal pillar and the sidewalls of the second metal pillar are completely covered by the solder region.

14. The structure of claim 13, wherein each of the second connectors further comprises a first under bump metal (UBM) structure between the second metal pillar and the upper surface of the interposer, wherein the solder region contacts and extends along sidewalls of the first UBM structure.

15. The structure of claim 14, wherein the sidewalls of the first UBM structure are aligned with the sidewalls of the second metal pillar along respective vertical lines perpendicular to the first side of the interposer.

16. The structure of claim 11, wherein each of the second connectors further comprises a second UBM structure between the first metal pillar and the lower surface the second die, wherein sidewalls of the second UBM structure are vertically aligned with respective sidewalls of the first metal pillar.

17. The structure of claim 16, wherein the sidewalls of the second UBM structure are free of the solder region.

18. A method of forming a semiconductor structure, the method comprising:

bonding a first die to a first side of an interposer by forming first connectors between the first die and the interposer; and bonding a second die to the first side of the interposer by forming second connectors between the second die and the interposer, wherein a diameter of the first connectors is larger than a diameter of the second connectors, wherein bonding the second die comprises:

aligning a first metal pillar of the second die with a second metal pillar of the interposer, wherein the first metal pillar is coupled to a first under bump metal (UBM) structure of the second die and protrudes from a lower surface of the second die facing the interposer, wherein the second metal pillar is coupled to a second UBM structure of the interposer and protrudes from an upper surface of the interposer facing the second die; and performing a reflow process to form a solder region between the first metal pillar and the second metal pillar, wherein the solder region bonds the first metal pillar to the second metal pillar, wherein sidewalls of the first metal pillar are free of the solder region after the reflow process, wherein the solder region contacts and extends along sidewalls of the second metal pillar and sidewalls of the second UBM structure.

19. The method of claim 18, wherein a lower surface of the first metal pillar facing the interposer is covered by a first conductive layer, wherein after the reflow process, the first conductive layer is disposed between the first metal pillar and the solder region, and sidewalls of the first conductive layer are free of the solder region.

20. The method of claim 18, wherein the second UBM structure and the second metal pillar have a same width such that the sidewalls of the second UBM structure are aligned with respective sidewalls of the second metal pillar.

* * * * *